United States Patent [19]
Rasche et al.

[11] Patent Number: 5,933,006
[45] Date of Patent: Aug. 3, 1999

[54] MR METHOD FOR THE REDUCTION OF MOTION ARTEFACTS, AND DEVICE FOR CARRYING OUT THE METHOD

[75] Inventors: Volker Rasche; Roland Proska, both of Hamburg, Germany

[73] Assignee: U.S. Philips Corporation, New York, N.Y.

[21] Appl. No.: 08/966,597

[22] Filed: Nov. 10, 1997

[30] Foreign Application Priority Data

Nov. 16, 1996 [DE] Germany .......................... 196 47 537

[51] Int. Cl.$^6$ ........................................... G01V 3/00
[52] U.S. Cl. ........................................... 324/307; 324/306
[58] Field of Search ................... 324/306, 307, 324/309, 312, 314, 300

[56] References Cited

U.S. PATENT DOCUMENTS 4,954,779  9/1990  Zur ........................................... 324/306
5,729,140  3/1998  Kruger et al. ........................... 324/309
5,742,163  4/1998  Liu et al. ................................. 324/309

*Primary Examiner*—Louis Arana
*Attorney, Agent, or Firm*—Dwight H. Renfrew, Jr.

[57] ABSTRACT

An MR method for the reduction of motion artefacts is applicable to procedures where a plurality of MR data sets concerning an object to be examined are acquired successively in time. Because the object to be examined is liable to move during the period of time required to acquire an MR data set for the reconstruction of a high-resolution MR image, the high-resolution MR image often contains disturbing motion artefacts. In order to avoid such motion artefacts in the high-resolution MR images, first a plurality of MR data sets are acquired for low-resolution MR images; this operation can be performed within a shorter measuring period. Image transformation parameters are determined from the comparison of the low-resolution images so as to be taken into account for the reconstruction of the high-resolution MR image from the MR data sets acquired.

14 Claims, 4 Drawing Sheets

MR METHOD FOR THE REDUCTION OF MOTION ARTEFACTS, AND DEVICE FOR CARRYING OUT THE METHOD

BACKGROUND OF THE INVENTION

1. Field of the Invention

The invention relates to a magnetic resonance (MR) method for the reduction of motion artefacts in which a plurality of MR data sets concerning an object to be examined are acquired successively in time.

The invention also relates to an MR device for carrying out the method, including means for forming MR images from MR signals, a programmable control unit for controlling said means, and a reconstruction unit for reconstructing MR images by means of the projection reconstruction method.

2. Description of the Related Art

An MR method and MR device of this kind are known from U.S. Pat. No. 5,502,385. According to the method disclosed therein, MR sequences with continuously varied magnetic gradient fields act on the object to be examined. MR images are reconstructed from the MR signals thus generated, the oldest MR signals taken into account for the reconstruction of an MR image being replaced by the respective newly generated MR signals for the reconstruction of the next MR image. Dynamic processes taking place in the examination zone can then be reproduced with few artefacts by varying the direction of the magnetic gradient field applied during the generating of an MR signal from one sequence to another in such a manner that the range of magnetic gradient field directions required for the reconstruction is uniformly distributed between the respective newly generated MR signals.

Generally speaking, the acquisition of an MR data set of a moving object in order to form a high-resolution MR image requires a period of time which is not negligibly small in relation to the movement of the object. Because of the motion of the object to be examined in the course of the data acquisition, therefore, artefacts are liable to occur in the high-resolution MR image reconstructed by means of the known method. However, when a given resolution of the MR image is specified, the measuring time generally can be reduced to a very small extent only.

SUMMARY OF THE INVENTION

It is an object of the invention to provide an MR method and an MR device of the kind set forth which produce fewer artefacts in high-resolution MR images of dynamic processes in the examination zone.

This object is achieved by the MR method according to the invention in that a respective low-resolution MR image is reconstructed from the MR data sets, that image transformation parameters are determined from a comparison of the low-resolution MR images, and that a high-resolution MR image is reconstructed from the MR data sets in dependence on the image transformation parameters.

In accordance with the invention, the period of time required to acquire a single MR data set wherefrom a high-resolution MR image can be reconstructed is subdivided into a plurality of (shorter) periods of time, in each of which a respective MR data set is acquired. A low-resolution MR image can be reconstructed from each MR data set. In this context the term low-resolution is to be understood to mean that the MR data set required for the reconstruction is acquired by means of a number of MR sequences which is smaller than the number of MR sequences used to acquire an MR data set for the reconstruction of a high-resolution MR image. In the so-called k space (spatial frequency space) this means that the k space is scanned along fewer paths in comparison with the reconstruction of a high-resolution MR image and that, therefore, the density of the scanning points in the angular direction in the k space is less.

The image transformation parameters describe how the position of individual pixels, image segments or complete image objects (for example, bones) (collectively referred to as "image elements") has changed in the successive low-resolution MR images. Each pixel, image segment or image object is then assigned a respective image transformation parameter which is derived from the comparison of two, preferably temporally successive low-resolution MR images and describes the change of the position of the pixel, image segment or image object from the first to the second mutually compared MR image quasi as a motion vector. The image transformation parameters derived from the comparison of two low-resolution MR images could be combined, for example in the form of an image transformation matrix (a so-called motion vector field).

A high-resolution MR image can then be reconstructed from these image transformation parameters and the MR data sets wherefrom the low-resolution MR images have been reconstructed; this high-resolution MR image will not exhibit any or only few motion artefacts, provided that the objects in the examination zone have merely been shifted, rotated or distorted during the acquisition of the MR data sets, but no new objects have entered the examination zone.

A version of the method according to the invention is characterized in that the location of pixels in a low-resolution MR image which acts as a reference image is determined, that the location of the pixels in the other low-resolution MR images is determined, and that the image transformation parameters are determined from the comparison of the location of the pixels in the reference image and the location of the pixels in the other low-resolution MR images. The low-resolution MR image reconstructed from the MR data set acquired first in time is preferably used as the reference image, the image transformation parameters then describing the shift of the pixels in the subsequent MR images. However, another MR image may also be chosen as the reference image.

A further version of the invention which is based thereon is characterized in that in the reference image the location of pixels is determined in locations which correspond to raster points of a raster on which the high-resolution MR image is reconstructed. Because the image transformation parameters are taken into account for the reconstruction of the high-resolution MR image, it is advantageous when the raster used for the reconstruction of the high-resolution MR image is also used for the determination of the image transformation parameters. To this end, the (low-resolution) reference image is subdivided in conformity with this raster (preferably the reference image as well as the other low-resolution MR images are reconstructed on this raster) and the positions of pixels at the raster points of this raster in the reference image are determined and tracked in the other low-resolution MR images. The computation effort for the reconstruction of the high-resolution MR image would otherwise be additionally increased, because the image transformation parameters would have to be adapted to the raster for the reconstruction of the high-resolution image before the high-resolution image could be reconstructed.

In a particularly attractive version of the invention the image values of the high-resolution MR image are determined by a respective addition of sub-image values, a first sub-image value being determined from a first MR data set by reconstruction at a raster point of a basic raster while the further sub-image values are determined from a respective one of the other MR data sets by reconstruction at a raster point of a raster derived from the basic raster by means of the associated image transformation parameter. An image value of the high-resolution MR image is composed of a plurality of sub-image values, the number of sub-image values corresponding to the number of MR data sets. A sub-image value is then derived from each MR data set. First the first sub-image value is reconstructed at a raster point of the basic raster. Subsequently, this raster point is shifted by means of the associated image transformation parameter and the new position of the raster point is determined. At that location the next sub-image value is reconstructed from the associated next MR data set. This operation is repeated for all MR data sets. Subsequently, all sub-image values determined are added, yielding the image value of the high-resolution MR image. The position of this image value in the high-resolution MR image corresponds to the position of the raster point of the basic raster on which the first sub-image value was reconstructed. Consequently, motions having taken place in the examination zone during the acquisition of the MR data sets are taken into account and eliminated quasi a posteriori from the MR data sets during the reconstruction of the high-resolution image.

A further version according to the invention is characterized in that for the reconstruction of the high-resolution MR image an MR basic image is formed from an MR data set on a basic raster, that a respective MR image is formed from the remaining MR data sets on a further raster derived from the basic raster by means of the associated image transformation parameter, and that the MR basic image and the MR images are superposed so as to form a high-resolution MR image. A motion having occurred during the acquisition of the MR data sets then being taken into account in that the basic raster is transformed, by means of the image transformation parameter, into further rasters on which the MR images are reconstructed from the MR data sets associated with the transformed rasters. Generally speaking, these MR images cannot be reproduced since the transformed rasters generally do not have a regularity such as, for example a Cartesian raster. Because of the linearity of the reconstruction, the high-resolution MR image is obtained by superposition (summation) of the MR basic image and the MR images.

In a preferred version of the invention, the k space is scanned along paths extending radially through the zero point of the k space in order to acquire an MR data set. To this end, the MR sequences have different phase encoding gradients. Such radial scanning of the k space offers the advantage that MR images can be simply formed by means of the projection-reconstruction method.

A further version which is based thereon is characterized in that the paths followed to acquire an MR data set intersect the paths followed to acquire the further MR data sets at an angle. Preferably, the k space is uniformly scanned during the acquisition of the MR data sets required for the reconstruction of a high-resolution MR image, all angles between two neighboring paths being equal for this purpose.

The object of the invention is also achieved by an MR method of the kind set forth which is characterized in that parallel to the acquisition of the MR data sets the location of microcoils arranged at predetermined positions of the object to be examined is determined, that image transformation parameters are determined from the comparison of temporally successive location data of the microcoils, and that a high-resolution MR image is reconstructed from the MR data sets in dependence on the image transformation parameters. Thus, according to this method instead of determining and tracking the position of pixels or image objects in the low-resolution MR images, the position of microcoils arranged in advance on or in the object to be examined is determined and tracked, each of said coils also acquiring an MR signal during the acquisition of the MR data sets. The image transformation parameters are then derived therefrom. The high-resolution MR image is subsequently reconstructed in the manner described above.

In a further version of the invention, one or more low-resolution MR images and/or the high-resolution MR image are displayed. The observer can thus be presented with MR images with different temporal and spatial resolutions. Whereas the low-resolution MR images have a high temporal resolution at the expense of a low spatial resolution, as is desirable, for example for fluoroscopy applications (for example, in the case of interventional applications), the high-resolution MR image has a high spatial resolution at the expense of the temporal resolution. It is also feasible to allow the observer to select the spatial and/or temporal resolution and the number of MR images displayed.

A further version which is based thereon is characterized in that the high-resolution MR image is reconstructed from the MR data sets without taking into account the image transformation parameters. Thus, instead of the high-resolution MR image reconstructed in dependence on the image transformation parameters, the observer can be offered an MR image reconstructed from the MR data sets by means of conventional methods. This MR image may contain motion artefacts, but the calculation of the image transformation parameters can then be dispensed with and the reconstruction of the high-resolution MR image requires less computation effort. The low-resolution MR images can also be reproduced on the raster of the high-resolution MR image; for this purpose the low-resolution MR images must be suitably zoomed, for example by means of mathematical methods. In this further version the MR data sets need not be acquired by radial scanning of the k space; scanning can also be performed in a different manner.

The object according to the invention in respect of the MR device is achieved in that the control unit is programmed in such a manner that a plurality of MR data sets of an object to be examined are acquired successively in time, and that the reconstruction unit reconstructs a respective low-resolution MR image from an MR data set, derives image transformation parameters from the comparison of the low-resolution MR images, and reconstructs a high-resolution MR image from the MR data sets in dependence on the image transformation parameters.

BRIEF DESCRIPTION OF THE DRAWING

The invention will be described in detail hereinafter with reference to the drawing. Therein.

DETAILED DESCRIPTION OF THE PREFERRED EMBODIMENTS

Figure 1:
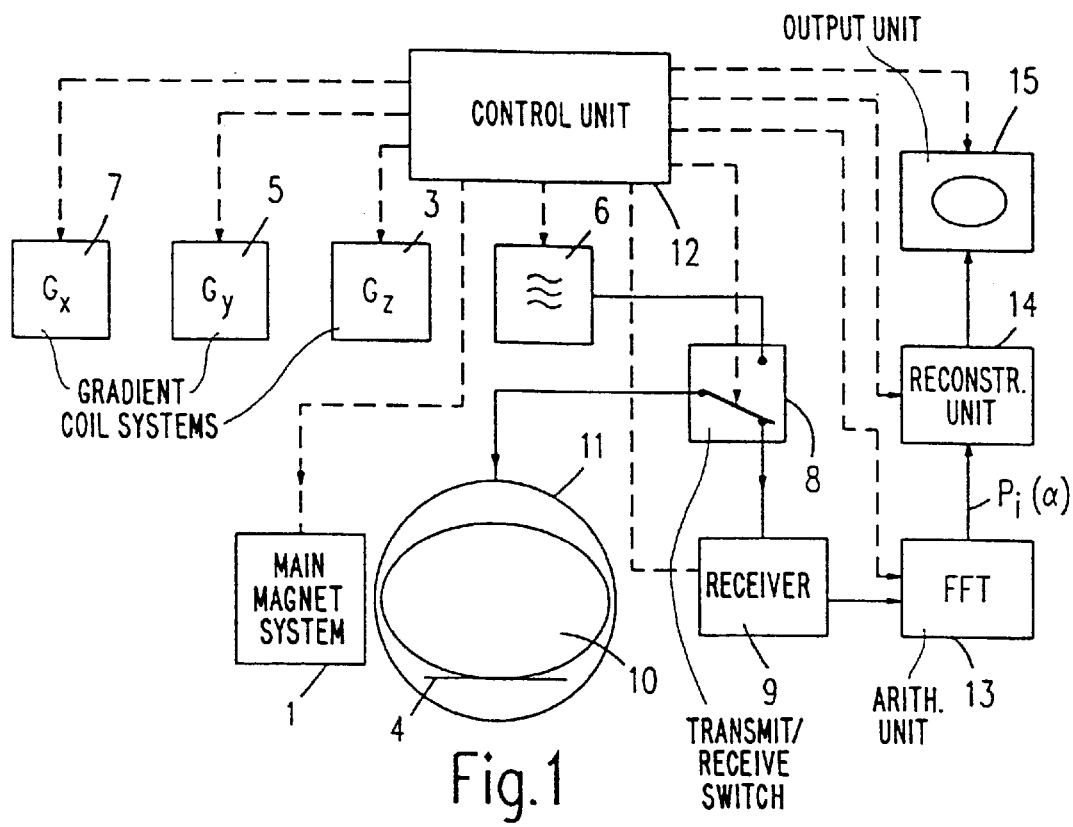
FIG. 1 shows a block diagram of an MR device which is suitable to carry out the invention.

FIG. 1 shows a block diagram of an MR device for carrying out the method according to the invention. The reference numeral 1 denotes a main magnet system for generating a uniform, steady magnetic field which may consist, for example of four coils. Inside this system the patient 10 to be examined is arranged on a table top 4. Three gradient coil systems 3, 5, 7 are provided in order to generate so-called gradient magnetic fields $G_x$, $G_y$, $G_z$. Each of these systems generates a respective magnetic field which extends in the direction of the uniform magnetic field and linearly varies in one of the three spatial directions.

Also provided is an RF coil 11 which can be connected, via a transmit/receive switch 8, either to an oscillator 6 for generating RF pulses or to a receiver 9 for receiving the MR signals generated in the examination zone. However, it is also possible to use a separate RF receiving coil (not shown in FIG. 1) for the reception of MR sequences. The foregoing elements of the MR device are controlled by a control unit 12 which notably controls also the temporal succession of MR sequences.

An FFT arithmetic unit 13 calculates projections $P_i(\alpha)$ from the MR signals measured, an artefact-free high-resolution MR image being reconstructed from said projections in the reconstruction unit 14 by means of the method according to the invention. This image can subsequently be displayed on the output unit 15. The units 13, 14, 15 are also controlled by the control unit 12.

Figure 2:
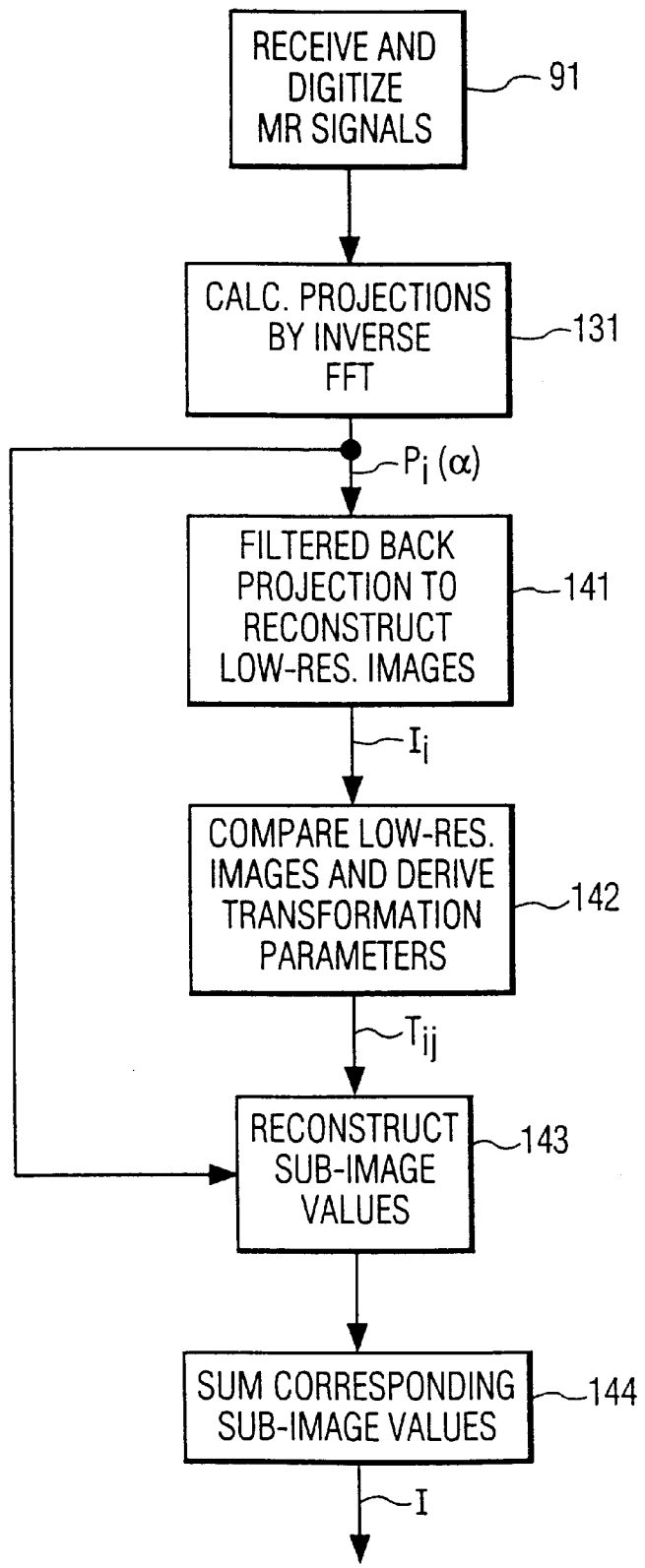
FIG. 2 shows a flow chart illustrating the method according to the invention.

The method according to the invention will be described in detail with reference to the flow chart of FIG. 2. Notably the steps performed by the reconstruction unit 14 are illustrated therein by way of the blocks 141 to 144.

After reception and digitization 91; in the receiver 9, each MR signal; present at the receiver output as a series of digital scanning values is subjected to an inverse fast Fourier transformation 131 by arithmetic unit. The projections $P_i(\alpha)$ derived therefrom are subsequently used to reconstruct MR images $I_i$ by means of filtered backprojection in the block 141. Whereas customarily all projections $P_i(\alpha)$ determined in a given time interval during the scanning of the k space are used to reconstruct a high-resolution MR image, according to the invention first a plurality of low-resolution MR images $I_i$ are reconstructed, only a number of the previously acquired projections $P_i(\alpha)$ being used for the reconstruction of each low-resolution MR image $I_i$. Each projection $P_i(\alpha)$ is used exactly once. For example, instead of a high-resolution MR image reconstructed from 180 projections $P_i(\alpha)$, according to the invention first three low-resolution MR images $I_i$ (i=1 . . . 3) are reconstructed from each time 60 projections $P_i(\alpha)$.

The k space is uniformly scanned so as to derive the projections $P_i(\alpha)$ for a low-resolution MR image $I_i$. This will be described in detail with reference to FIG. 3 which shows the scanning of the k space according to the invention. Each MR sequence, or each MR signal thus acquired (wherefrom a projection is calculated by means of FFT), corresponds to a straight line through the zero point of the k space, the direction of the straight line corresponding to the gradient direction of the gradient magnetic fields. In a first time interval the k space is scanned along the solid paths $S_{11}$, $S_{12}$, $S_{13}$, $S_{14}$. Subsequently, scanning takes place along the dashed paths $S_{21}$, $S_{22}$, $S_{23}$, $S_{24}$ and after that along the dash/dot paths $S_{31}$, $S_{32}$, $S_{33}$, $S_{34}$. It appears that the gradient directions of a group of scans deviate from those of the other group by each time a constant angle ($\alpha_{21}$), that is to say in such a manner that the directions of the N (N=12 in the present example) scanning paths of the N/n scanning groups ($^{12}/_4$=3 in the present example, n being the number of scanning paths per scanning group) are regularly distributed across the k space. Thus, in the present example: $\alpha_{31}=2\alpha_{21}$ and $\alpha_{12}=3\alpha_{21}$.

On the basis of the projections $P_1$, acquired along the paths $S_{11}$ to $S_{14}$ of the first scanning group and together constituting a first MR data set, subsequently a first low-resolution MR image $I_1$ is reconstructed; a second low-resolution MR image $I_2$ is reconstructed from the projections $P_2$ (the second MR data set) of the second scanning group (paths $S_{21}$ to $S_{24}$), and a third low-resolution MR image $I_3$ is reconstructed from the projections $P_3$ (the third MR data set) of the third scanning group (paths $S_{31}$ to $S_{34}$). These reconstructions are performed by way of filtered backprojection in block 141, which means that only the data of the projections which is situated within the circle M in the k space is used for the reconstruction, because the density of the scanning points outside this circle is too low.

Figure 4:
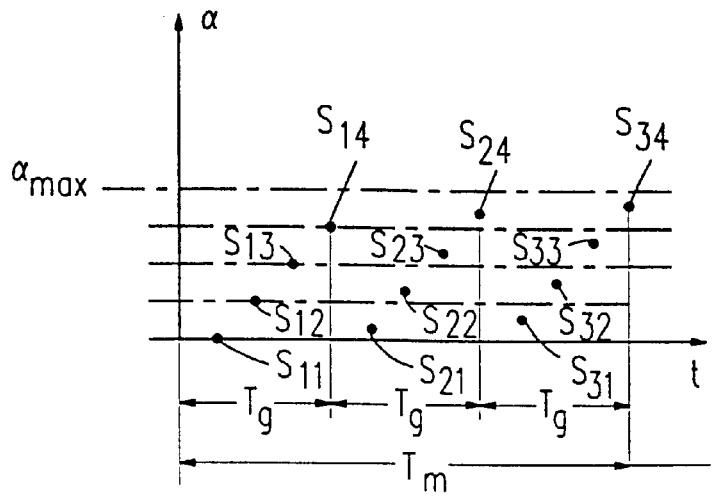
FIG. 4 shows the temporal succession of the scans of FIG. 3.

The temporal succession of the scans is shown again in FIG. 4, the gradient direction $\alpha$ being plotted as the ordinate and the time t as the abscissa.

Each point in this diagram corresponds to the acquisition of an MR signal. The angular range between 0 and $\alpha_{max}$ is then the range of gradient directions required for the reconstruction of a high-resolution MR image. It appears that the paths of a scanning group are successively followed in a respective time interval $T_g$. During the first time interval $T_g$, for example, the paths of the first scanning group are followed so as to acquire the projections $P_1$. Overall, the time $T_m=3\ T_g$ is required in the example shown (generally speaking, $T_m=N/n\ T_g$).

In block 142 (FIG. 2) the low-resolution MR images $I_i$ thus obtained are compared and the image transformation parameters $T_{ij}$ are derived therefrom. This will be described in detail with reference to FIG. 5.

Figure 3:
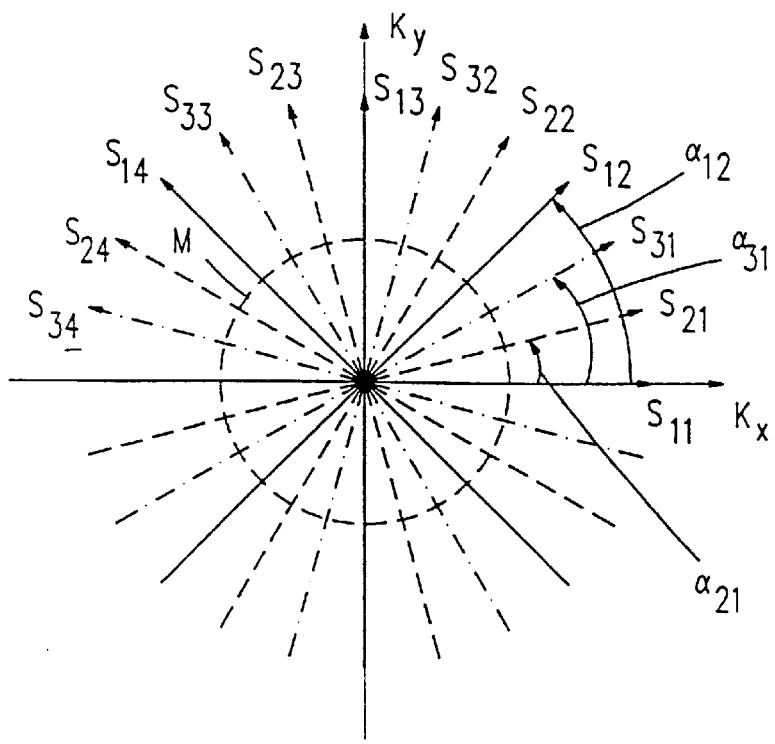
FIG. 3 shows the scanning of the k space according to the invention.
Figure 5:
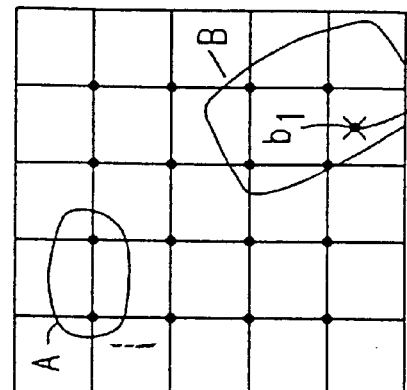
FIG. 5 shows a plurality of successive low-resolution MR images.
Figure 5:
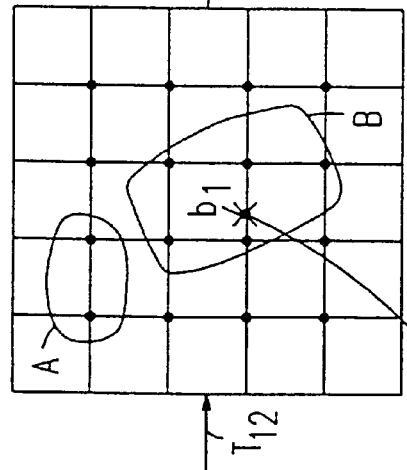
Figure 5:
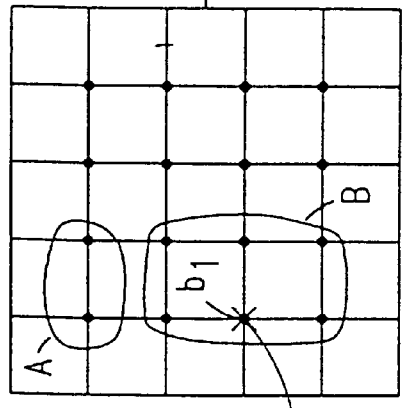

FIG. 5 shows three temporally successive low-resolution MR images $I_1$, $I_2$, $I_3$ acquired, for example from projections of a scan of the k space in conformity with FIG. 3. Two image objects A and B can be recognized, the image object B having moved during the acquisition of the MR data. The image transformation parameters $T_{12}$ are derived from a comparison of the second MR image $I_2$ with the first MR image $I_1$, acting as a reference image $I_{ref}$, the image transformation parameters $T_{23}$ being derived from the comparison of the third MR image $I_3$ with the second MR image $I_2$. To this end, in the reference image $I_{ref}$ pixels are determined at selected locations, for example at the raster points of the raster $R_1$ used for the reconstruction of the reference image $I_{ref}$, and the position of these pixels in the subsequent MR images $I_2$, $I_3$ is determined. This will be explained, by way of example, with reference to the pixel $b_1$.

The pixel $b_1$ of the image object B is situated at the raster point $r_{31}(I_1)$ of the raster $R_1$ in the reference image $I_{ref}$. Because of the motion of the image object B, the position of the pixel $b_1$ in the images $I_2$ and $I_3$ also changes as appears from FIG. 5. From the comparison of the position of the pixel $b_1$ in the three low-resolution MR images $I_1$, $I_2$, $I_3$, therefore, the image transformation parameters are determined for the pixel $b_1$ situated at the raster point $r_{31}$. The location of a selected pixel can be determined in the MR images, for example by determining the intensity (its image value) associated with this pixel in the reference image and by determining the position of the pixel on the basis of its image value in the other MR images. A mathematical method for this purpose is known, for example from IEEE, Transactions on Circuits and Systems for Video Technology, Vol. 3, No. 5 (1993), page 368.

This operation is performed for all pixels situated at the raster points of the raster $R_1$. in the reference image $I_{ref}$ wherefrom all image transformation parameters $T_{12}$ and $T_{23}$ are derived.

Figure 6:
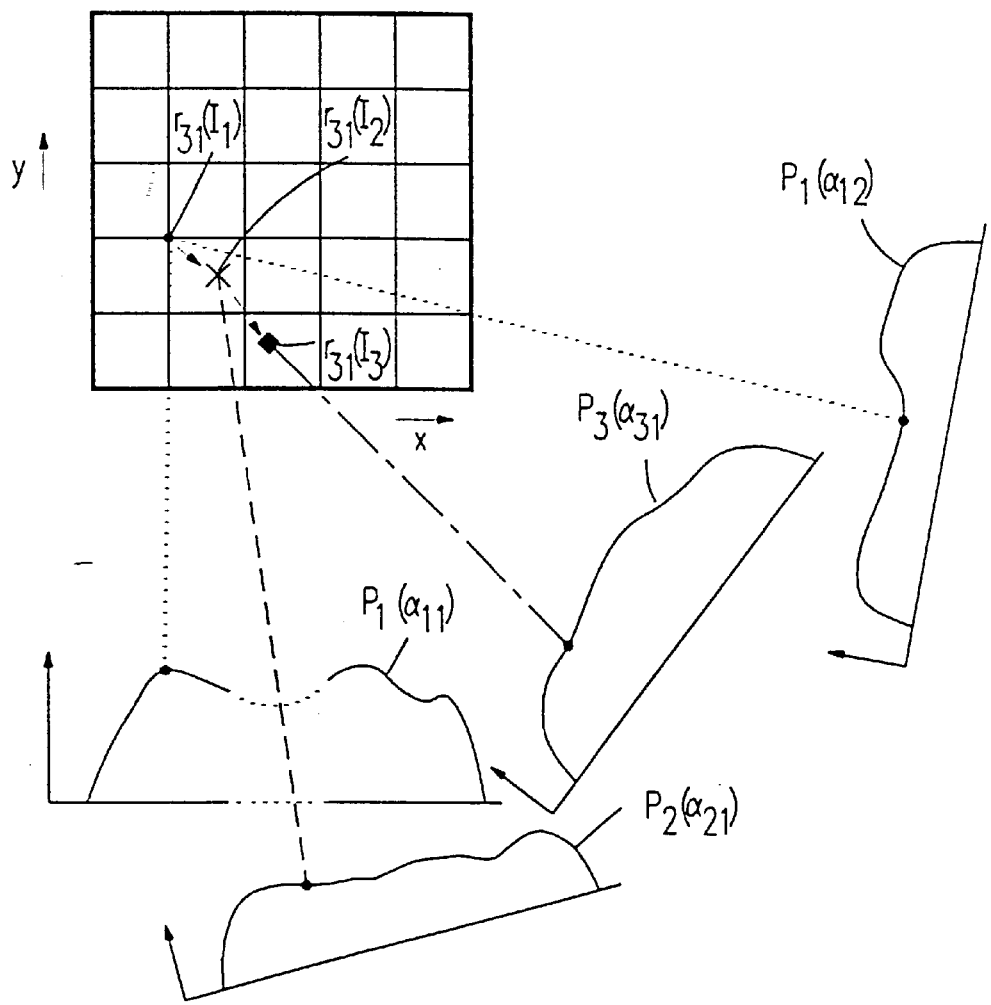
FIG. 6 illustrates the reconstruction of the high-resolution MR image according to the invention.

Subsequently, in the block 143 (FIG. 2) the image values of the high-resolution MR image I are calculated from the image transformation parameters $T_{ij}$ and the projections $P_i(\alpha)$. The calculation of an image value of the high-resolution MR image I will be described in detail with reference to FIG. 6. This Figure shows the space of the high-resolution MR image I with the co-ordinates x and y.

First, at the position $r_{31}(I_1)$, where the pixel b, is situated in the first low-resolution MR image $I_1$, a first sub-image value is reconstructed from the first projection $P_1(\alpha_{11})$. This is denoted by the dotted line from the projection $P_1(\alpha_{11})$ to the position $R_{31}(I_1)$ in the drawing. At the same location further sub-image values are reconstructed from the further projections $P_1(\alpha_{1v}; v=2, 3, 4)$ acquired along the further paths $S_{12}$ to $S_{14}$ of the first scanning group (FIG. 3), said further sub-image values being added to the first sub-image value. The drawing shows only the reconstruction from the projection $P_1(\alpha_{12})$ by way of a dotted line.

Subsequently, at the location $r_{31}(I_2)$, at which the pixel $b_1$ is situated in the second low-resolution MR image $I_2$, sub-image values are reconstructed and added from the projections $P_2(\alpha_{2v}, v=1, 2, 3, 4)$ acquired along the paths $S_{21}$ to $S_{24}$ of the second scanning group. The same takes place at the location $r_{31}(I_3)$, at which the pixel $b_1$ is situated in the third low-resolution MR image $I_3$, on the basis of the projections $P_3(\alpha_{3v}; v=1, 2, 3, 4)$ of the third scanning group (paths $S_{31}$ to $S_{34}$). This is indicated in the drawing by a dashed line from the projection $P_2(\alpha_{21})$ to the location $r_{31}(I_2)$ and by a dash-dot line from the projection $P_3(\alpha_{31})$ to the location $r_{31}(I_3)$, respectively.

Subsequently, all sub-image values determined are summed in the block 144 (FIG. 2), thus yielding the image value of the high-resolution MR image situated at the location $r_{31}(I_1)$. The described reconstruction of the sub-image values utilizes all data of the projections determined along the paths in the k space, so not only the data of the projections situated within the circle M as was the case for the formation of the low-resolution MR images.

This method is repeated for all raster points $r_{kl}$ (k=1, 2, ... K; l=1, ..., L; K=number of raster points in the y direction, L=the number of raster points in the x direction) of the raster $R_1$, i.e. all image values of the high-resolution MR image I are obtained from sub-image values acquired from respective different projections by reconstruction at different raster points. In other words, the first sub-image values are reconstructed on the basic raster $R_1$ from the projections $P_1$ of the first scanning group and the further sub-image values, on rasters which are derived from the basic raster by transformation by means of the image transformation parameters, are reconstructed from the projections of the further scanning groups, said sub-image values subsequently being added and reproduced on the basic raster $R_1$.

Figure 7:
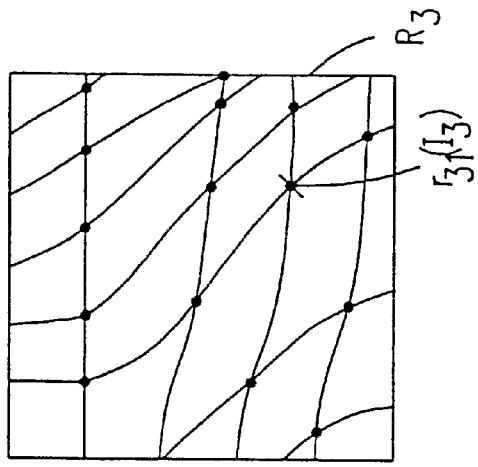
FIG. 7 shows rasters used for the reconstruction.
Figure 7:
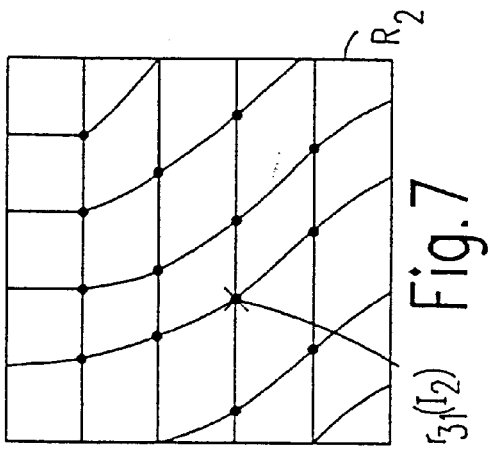
Figure 7:
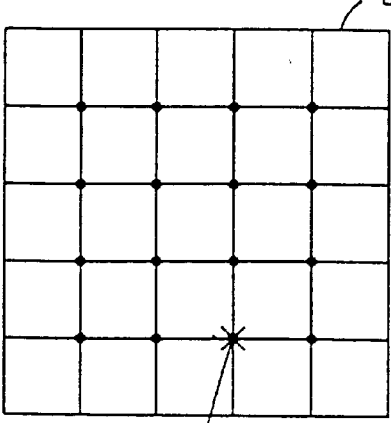

FIG. 7 shows the various rasters $R_1$ to $R_3$. The basic raster $R_1$, on which the high-resolution MR image I is to be reconstructed and reproduced, corresponds to the raster $R_1$ of the first low-resolution MR image $I_1$. The raster $R_2$ is derived from the basic raster $R_1$ by means of the image transformation parameter $T_{12}$ in that the co-ordinates of the new raster points of the raster $R_2$ are calculated from the co-ordinates of each raster point of the raster $R_1$ by means of the associated transformation parameter. Similarly, the raster $R_3$ is derived from the raster $R_2$ by means of the image transformation parameter $T_{23}$. For example, the raster point $r_{31}(I_1)$ of the raster $R_1$ is shifted to the raster point $r_{31}(I_2)$ in the raster $R_2$, at which the pixel $b_1$ was situated in the MR image $I_2$, and shifted to the raster point $r_{31}(I_3)$ in the raster $R_3$ at which the image point $b_1$ was situated in the MR image $I_3$. As has already been described, the sub-image values to be summed so as to form the image value of the high-resolution MR image are then reconstructed on the raster points of these rasters $R_1$, $R_2$, $R_3$.

For the calculation of the image transformation parameters it is not necessary that the pixels in the reference image whose location is tracked in the further low-resolution MR image are situated on a raster. It is also possible to select an arbitrary number of pixels in arbitrary (but known) locations for this purpose. The image transformation parameters can also be determined with an accuracy which is greater than the size of a pixel or smaller than the distance between two pixels.

For the calculation of the image transformation parameters it is also possible to zoom the low-resolution MR images first by means of mathematical methods and reproduce them on the raster of a high-resolution MR image. The image transformation parameters could then be determined at the raster points of the high-resolution MR image by means of the described method, so that more image transformation parameters would be obtained and ultimately also a higher accuracy.

Instead of the first low-resolution MR image in time, another MR image could also be selected as the reference image wherefrom the image transformation parameters are determined and ultimately the high-resolution MR image is reconstructed. The high-resolution MR image then shows the position of the image objects during a later phase of motion, i.e. at the instant at which the MR data set associated with the reference image was acquired.

Instead of the projection-reconstruction method, the discrete Fourier transformation could also be used for forming the low-resolution MR images and/or the high-resolution MR image; however, because of the necessary calculation of the image values on irregular rasters, significantly more time would then be required.

The method according to the invention can be used in situations where no new image objects enter the examination zone in the course of the imaging operation but the position of the image objects relative to one another is liable to change. This situation occurs, for example during dynamic studies of joints. Parts of the anatomy are displaced and/or distorted during the motion, but the anatomy itself does not change.

We claim:

1. An MR method for the reduction of motion artefacts comprising:

acquiring a plurality of MR data sets concerning an object to be examined successively in time, reconstructing a plurality of respective low-resolution MR images from the MR data sets, determining image transformation parameters from a comparison of the low-resolution MR images, the image transformation parameters describing changes in positions of image elements between the compared low-resolution images, and reconstructing a high-resolution MR image from the MR data sets in dependence on the determined image transformation parameters.

2. An MR method as claimed in claim 1, wherein the image elements comprise pixels, and wherein the locations of pixels in a low-resolution MR image which acts as a reference image are determined, the locations of the pixels in the other low-resolution MR images are determined, and the image transformation parameters are determined from the comparison of the locations of the pixels in the reference image and the locations of the pixels in the other low-resolution MR images.

3. An MR method as claimed in claim 2, wherein the locations of pixels in the reference image are determined as locations which correspond to raster points of a raster on which the high-resolution MR image is reconstructed.

4. An MR method as claimed in claim 1, wherein the image values of the high-resolution MR image are determined by a respective addition of sub-image values, first sub-image values being determined from a first MR data set by reconstruction at raster points of a basic raster while further sub-image values are determined from a respective one of the other MR data sets by reconstruction at raster points of a raster derived from the basic raster by shifting the basic raster points by the associated image transformation parameters.

5. An MR method as claimed in claim 1, wherein for the reconstruction of the high-resolution MR image, an MR basic image is formed from an MR data set on a basic raster, further MR images are formed from the remaining MR data sets on further rasters derived from the basic raster by shifting points of the basic raster by the associated image transformation parameters, and the MR basic image and the further MR images are superposed so as to form the high-resolution MR image.

6. An MR method as claimed claim 1, wherein the MR data sets are acquired by scanning k space along paths extending radially through the zero point of the k space.

7. An MR method as claimed in claim 6, wherein the paths followed to acquire each MR data set intersect the paths followed to acquire each other MR data set at a constant angle.

8. An MR method as claimed in claim 1, further comprising displaying one or more low-resolution MR image and/or more low-resolution MR images and/or high-resolution MR image.

9. An MR method as claimed in claim 8, wherein a further high-resolution MR image is reconstructed from the MR data sets without taking into account the image transformation parameters.

10. The method of claim 1 wherein the image transformation parameters comprise a motion vector field.

11. An MR method for the reduction of motion artefacts comprising:

acquiring a plurality of MR data sets concerning an object to be examined successively in time, determining data indicating the location of microcoils arranged at predetermined positions of the object to be examined parallel to the acquisition of the MR data sets, determining image transformation parameters from comparison of temporally successive location data of the microcoils, the image transformation parameters describing changes in positions of the microcoils, and reconstructing a high-resolution MR image from the MR data sets in dependence on the image transformation parameters.

12. An MR method as claimed in claim 11, further comprising displaying one or more low-resolution MR images and/or the high-resolution MR image.

13. An MR device comprising acquisition means for acquiring MR datasets, reconstruction means for generating MR images from MR data sets, and a programmable control unit for controlling said acquisition means and said reconstruction means, said control unit being programmed in such a manner that said acquisition means acquires a plurality of MR data sets of an object to be examined successively in time, and that said reconstruction means (I) reconstructs a plurality of respective low-resolution MR images from the MR data sets, (ii) determines image transformation parameters from the comparison of the low-resolution MR images, the image transformation parameters describing changes in positions of image elements between the compared low-resolution images, and (iii) reconstructs a high-resolution MR image from the MR data sets in dependence on the image transformation parameters.

14. The device of claim 13 wherein said reconstruction means generates MR images by a projection-reconstruction method or by a discrete Fourier transform method.

* * * * *